(12) United States Patent
Ohnishi et al.

(10) Patent No.: US 10,076,808 B2
(45) Date of Patent: Sep. 18, 2018

(54) LEAD-FREE SOLDER ALLOY

(71) Applicant: Senju Metal Industry Co., Ltd., Tokyo (JP)

(72) Inventors: Tsukasa Ohnishi, Tokyo (JP); Shunsaku Yoshikawa, Tokyo (JP); Ken Tachibana, Tokyo (JP); Yoshie Yamanaka, Tokyo (JP); Hikaru Nomura, Tokyo (JP); Kyu-oh Lee, Chandler, AZ (US)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/959,321

(22) Filed: Aug. 5, 2013

(65) Prior Publication Data

US 2015/0037088 A1    Feb. 5, 2015

(51) Int. Cl.
| | |
|---|---|
| B32B 15/01 | (2006.01) |
| B23K 35/26 | (2006.01) |
| B23K 1/00 | (2006.01) |
| B23K 35/02 | (2006.01) |
| C22C 13/00 | (2006.01) |
| B23K 101/40 | (2006.01) |

(52) U.S. Cl.
CPC .......... *B23K 35/262* (2013.01); *B23K 1/0016* (2013.01); *B23K 35/025* (2013.01); *B23K 35/0222* (2013.01); *B23K 35/0227* (2013.01); *B23K 35/0244* (2013.01); *B23K 35/26* (2013.01); *C22C 13/00* (2013.01); *B23K 2201/40* (2013.01); *Y10T 403/479* (2015.01)

(58) Field of Classification Search
None
See application file for complete search history.

(56) References Cited

U.S. PATENT DOCUMENTS

| | | |
|---|---|---|
| 5,520,752 A | 5/1996 | Lucey, Jr. et al. |
| 6,176,947 B1 | 1/2001 | Hwang et al. |
| 7,923,125 B2 * | 4/2011 | Key ......................... H01L 24/11 428/614 |
| 2006/0071860 A1 * | 4/2006 | Hozoji ..................... H01L 24/36 343/700 MS |

(Continued)

FOREIGN PATENT DOCUMENTS

| | | |
|---|---|---|
| GB | 2455486 A | 6/2009 |
| JP | 2002307187 A | 10/2002 |

(Continued)

OTHER PUBLICATIONS

Kiju Lee et al., Influence of indium addition on electromigration behavior of solder joint, Journal of Materials Research, 2011, pp. 2624-2631, vol. 26, No. 20.

*Primary Examiner* — Daniel J Schleis
(74) *Attorney, Agent, or Firm* — The Webb Law Firm

(57) ABSTRACT

A lead-free solder alloy capable of forming solder joints in which electromigration and an increase in resistance during electric conduction at a high current density are suppressed has an alloy composition consisting essentially of 1.0-13.0 mass % of In, 0.1-4.0 mass % of Ag, 0.3-1.0 mass % of Cu, a remainder of Sn. The solder alloy has excellent tensile properties even at a high temperature exceeding 100° C. and can be used not only for CPUs but also for power semiconductors.

7 Claims, 8 Drawing Sheets

(56) References Cited

U.S. PATENT DOCUMENTS

2006/0239855 A1* 10/2006 Nakatsuka ........... B23K 35/262
                                                        420/560
2007/0071634 A1*  3/2007 Huang et al. ................. 420/560
2010/0084050 A1*  4/2010 Kraemer et al. ................ 148/23
2010/0307823 A1* 12/2010 Kawamata et al. ........ 174/84 R
2012/0186629 A1*  7/2012 Nowlan ................ H01L 31/048
                                                        136/251

FOREIGN PATENT DOCUMENTS

| JP | 200540847 A  | 2/2005  |
| JP | 2006255762 A | 9/2006  |
| JP | 2007105750 A | 4/2007  |
| JP | 200970863 A  | 4/2009  |
| JP | 2009193967 A | 8/2009  |
| JP | 2013252548 A | 12/2013 |
| WO | 9709455 A1   | 3/1997  |

* cited by examiner

[Figure 1]
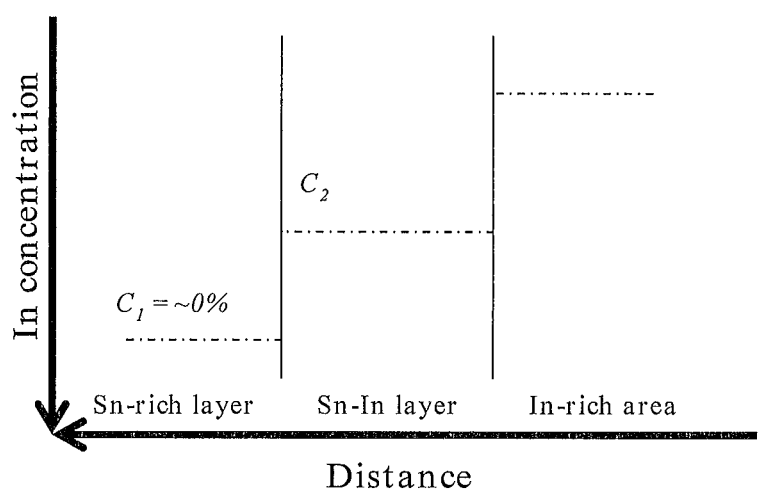

[Figure 2]
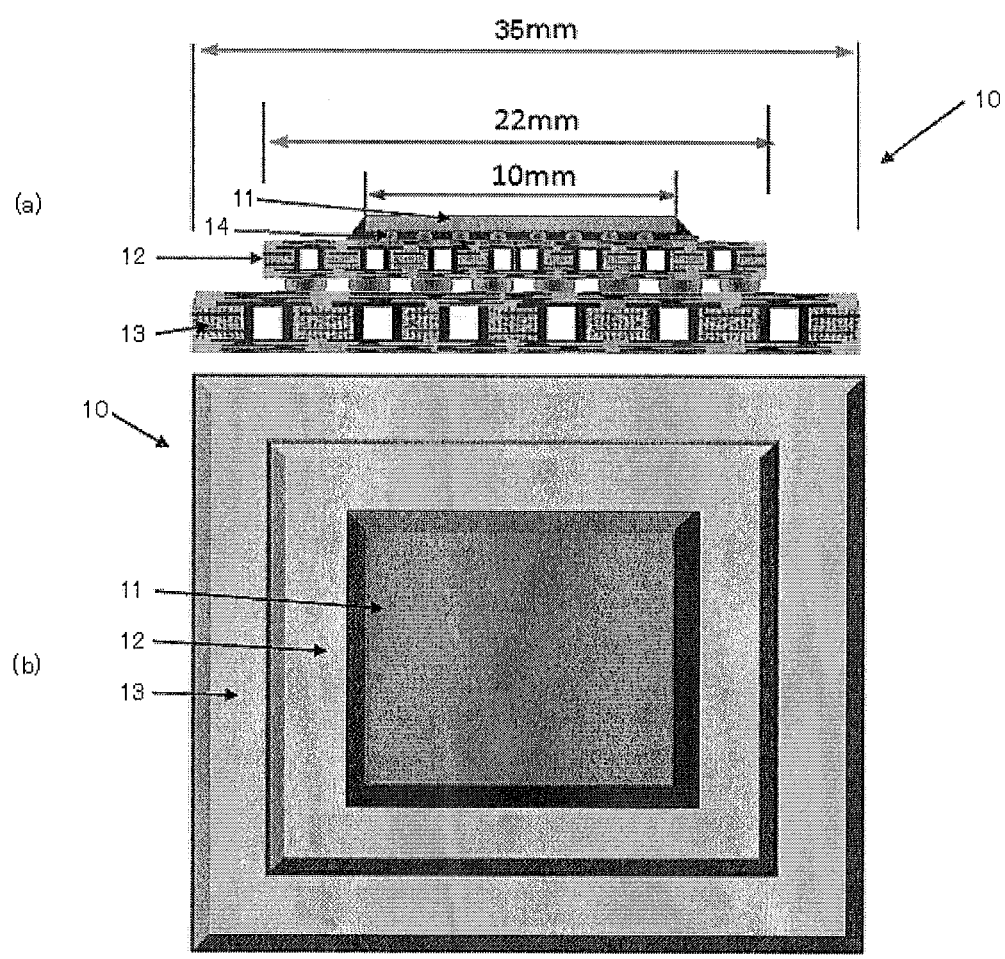

【Figure 3】
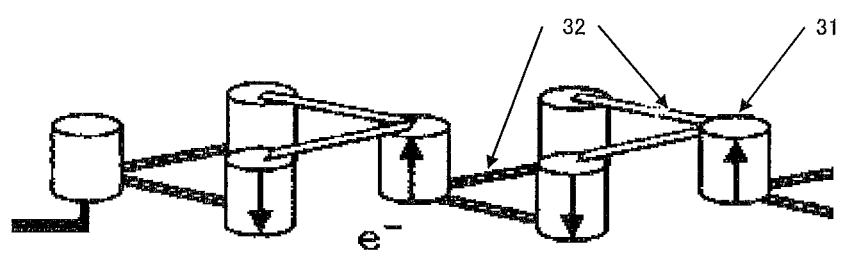
【Figure 4】
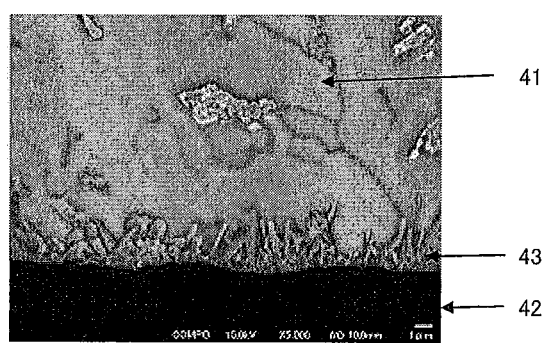

【Figure 5】
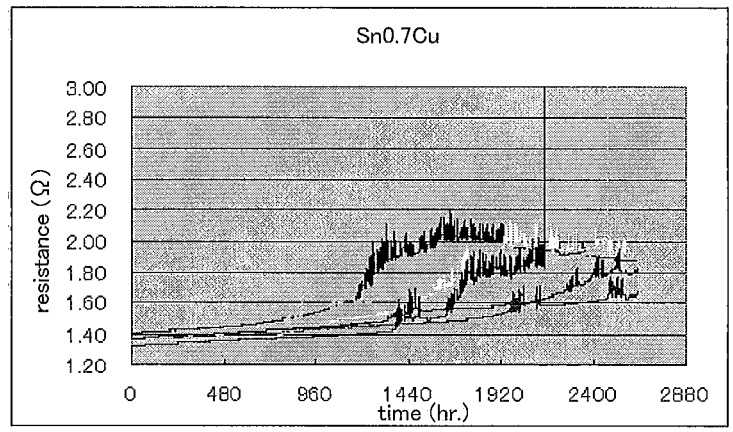
【Figure 6】
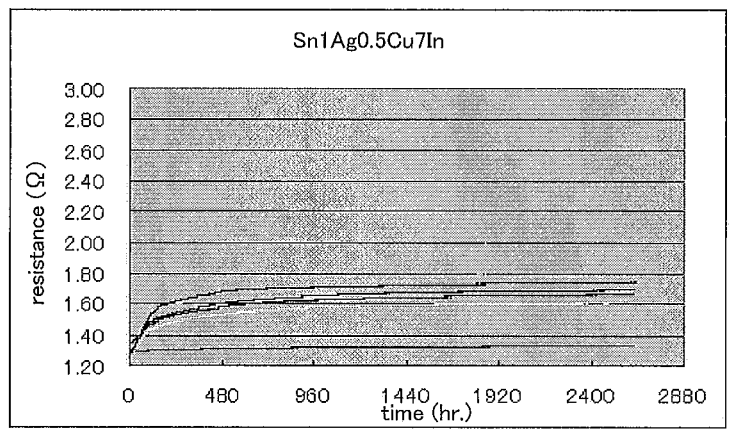

【Figure 7】
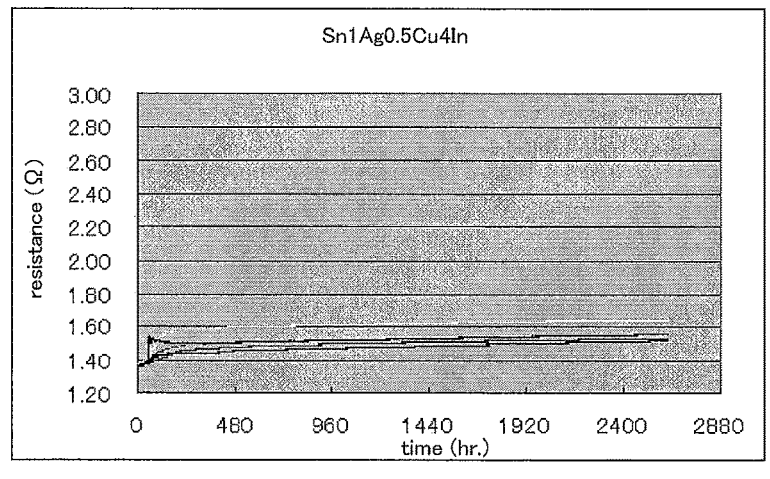
(a)
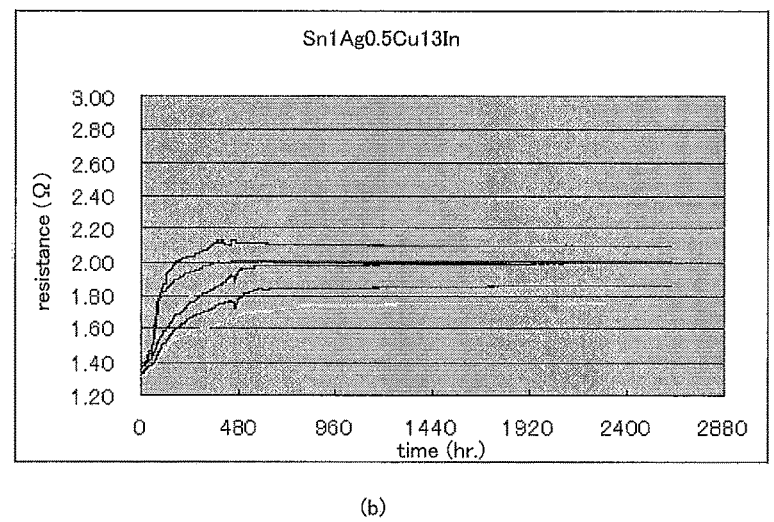
(b)

[Figure 8]
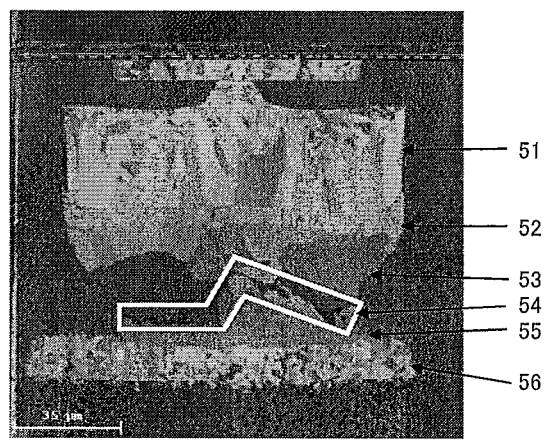
[Figure 9]
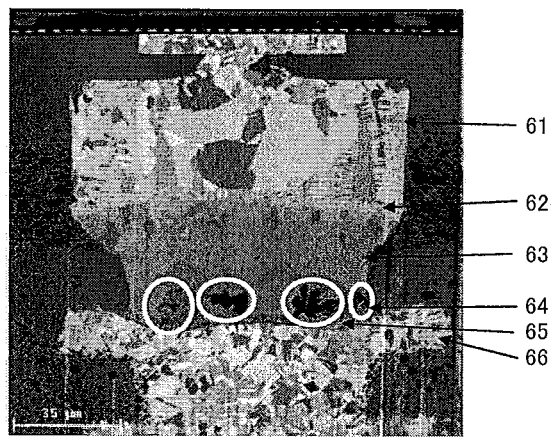

【Figure 10】
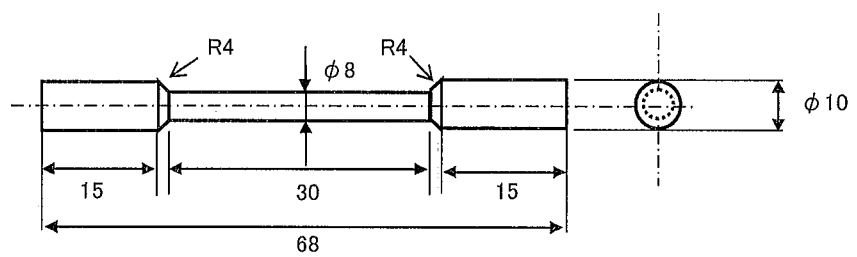

【Figure 11】
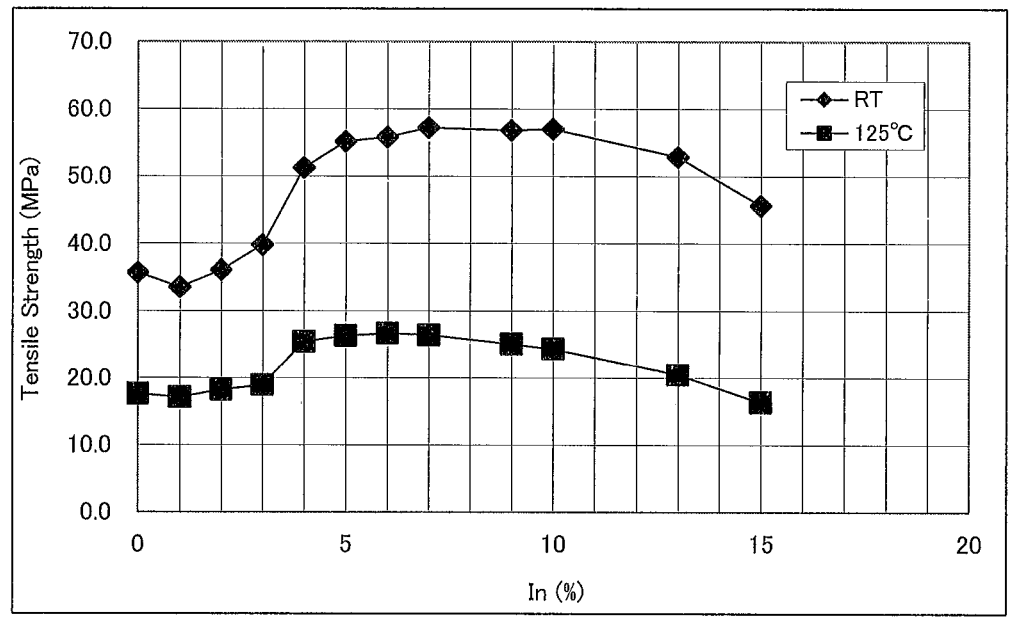
【Figure 12】
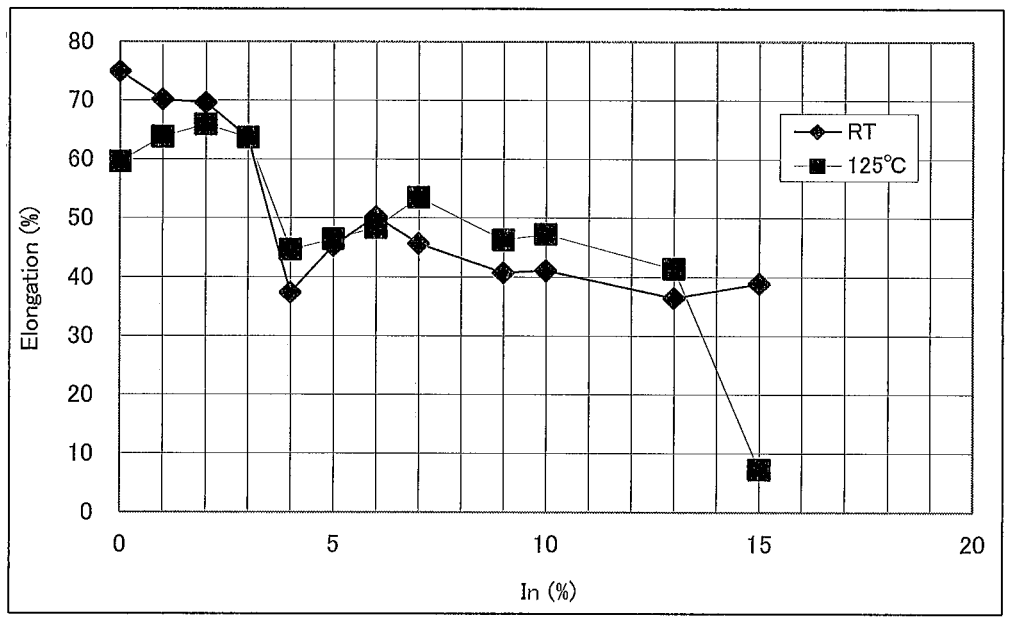

LEAD-FREE SOLDER ALLOY

TECHNICAL FIELD

This invention relates to a lead-free Sn—Ag—Cu based solder alloy which can be used in a high temperature, high current density environment.

BACKGROUND ART

In recent years, due to reductions in the size and increases in the performance of central processing units (CPUs) which are mainly used for computers, the current density per terminal of semiconductor elements mounted in CPUs has been increasing. It is said that the current density will reach the order of around $10^4$-$10^5$ A/cm$^2$ in the future. As the current density increases, the heat generated by passage of current increases, thereby elevating the temperature of the terminals and increasing the thermal vibrations of atoms in the terminals. As a result, the occurrence of electromigration developed in solder joints becomes marked, eventually leading to failure of the solder joints.

Electromigration (which may hereinafter be abbreviated as EM) is a phenomenon which occurs when a current is flowing through a conductor such as a solder joint. Atoms in the solder joint which are undergoing thermal vibrations collide with electrons forming the electric current, and momentum is transferred from the electrons to the atoms, thereby increasing the momentum of the atoms. The atoms having an increased momentum migrate toward the anode side of the solder joint by going along the flow of electrons. When atoms migrate toward the anode side of the solder joint, lattice vacancies develop on the cathode side of the solder joint. These lattice vacancies accumulate to form voids. Growth of the voids eventually causes failure of the solder joint. In this manner, electromigration develops in locations where electrical conduction takes place, and it has become a problem even inside solder joints.

The environment of use of a solder joint which is envisaged in this description is an environment at the time of operating CPUs with a high current density and is referred to below as a high current density environment. Evaluation of the reliability of a solder joint in such an environment can be carried out by an electromigration test (also referred to as an EM test) in which a current with a high current density of 0.12 mA/μm$^2$ is continuously passed through a solder joint for 2500 hours in air at 165° C.

Sn—Cu solder alloys and Sn—Ag—Cu solder alloys have been widely used as lead-free solder alloys. Sn—Cu solder alloys and Sn—Ag—Cu solder alloys easily develop electromigration because Sn, which is the main component of these alloys, has a large effective charge number. As a result, solder joints made of these alloys readily fail in a high current environment.

Patent Document 1 discloses a Sn—Ag—Cu—In solder alloy which has improved resistance to thermal fatigue and thereby suppresses the occurrence of cracks. The Sn—Ag—Cu—In solder alloy disclosed in Patent Document 1 has improved wettability due to the addition of a small amount of In. As a result, the occurrence of cracks and fracture of solder joints are suppressed.

PRIOR ART DOCUMENTS

Patent Documents

Patent Document 1: JP 2002-307187 A

SUMMARY OF THE INVENTION

However, Patent Document 1 does not contain any suggestion or teaching concerning suppressing the occurrence of electromigration and suppressing failure of solder joints by adding In to a Sn—Ag—Cu solder alloy. Although Patent Document 1 refers to resistance to thermal fatigue, it does not contain sufficient discussion of the effects when electrical conduction takes place for a long period in a high current density environment at a high temperature. Thus, the environment of operation of CPUs is not faithfully reproduced in Patent Document 1.

The specific solder alloys which are investigated in Patent Document 1 are ones having alloy compositions containing 0.5% In. These alloy compositions have an extremely low In content, which makes it impossible to confirm whether resistance to thermal fatigue is sufficiently improved by the addition of In. It is not verified at all whether these alloy compositions can avoid electromigration when electrical conduction takes place for a long period in a high current density environment at a high temperature. Accordingly, the solder alloy disclosed in Patent Document 1 cannot be said to solve the problem of increased electromigration due to the increase in current density in recent years.

The object of the present invention is to provide a lead-free solder alloy which can suppress an increase in the interconnection resistance of solder joints by suppressing of the growth of voids due to electromigration in a high temperature, high current density environment.

The present inventors performed detail investigation of the composition of a Sn—Ag—Cu—In solder alloy from the standpoint of suppressing the occurrence of electromigration. Namely, they considered that when Sn migrated toward the anode side along with the flow of electrons to leave lattice vacancies in the cathode side, In might fill the lattice vacancies and could suppress the growth of the lattice vacancies. As a result, they found that an In content of 1.0-13.0% in a Sn—Ag—Cu—In solder alloy can effectively suppress the formation of lattice vacancies and the growth of voids due to electromigration, and they thereby completed the present invention.

The present invention provides a lead-free solder alloy having an alloy composition consisting essentially of, in mass percent, In: 1.0-13.0%, Ag: 0.1-4.0%, Cu: 0.3-1.0%, and a remainder of Sn.

In one embodiment of the present invention, the Ag content of the lead-free solder alloy is 0.3-3.0% by mass.

In another embodiment of the present invention, the lead-free solder alloy contains, in mass percent, In: 2.0-13.0%, Ag: 0.3-3.0%, and Cu: 0.5-0.7%.

In yet another embodiment of the present invention, the lead-free solder alloy contains, in mass percent, In: 5.0-10.0%, Ag: 0.1-1.5%, and Cu: 0.3-1.0%.

The present invention also provides a solder joint made from any of the lead-free solder alloys described above.

A solder joint according to the present invention has a value of percent increase in the resistance after 2500 hours of conduction in air at 165° C. with a current density of 0.12 mA/μm$^2$ which is at most 30% compared to the resistance before the start of conduction and is at most 5% compared to the resistance at 500 hours after the start of conduction.

The present invention also provides a method of suppressing electromigration of a solder joint during electrical conduction comprising forming a solder joint using the above-described solder alloy.

BRIEF EXPLANATION OF THE DRAWINGS

FIG. 1 schematically shows the relationship between the In concentration of a solder joint and the distance from the cathode side of the solder joint at the end of an EM test.

FIGS. 2(a) and 2(b) are a schematic vertical cross-sectional view and a schematic plan view, respectively, of a FCLGA package used in an EM test.

FIG. 3 schematically shows the flowing directions of electrons (e⁻) in soldered joints which are subjected to an EM test.

FIG. 4 is a cross-sectional SEM photograph showing intermetallic compounds formed at the boundary between a solder joint made of a Sn-7In-1Ag-0.5Cu solder alloy and an electrode with a Ni/Au coating.

FIG. 5 is a graph showing the variation in the resistance of a solder joint made of a Sn-0.7Cu solder alloy as a comparative example as a function of the length of time of an EM test.

FIG. 6 is a graph showing the variation in the resistance of a solder joint made of a Sn-1Ag-0.5Cu-7In solder alloy according to the present invention as a function of the length of time of an EM test.

FIGS. 7(a) and 7(b) are graphs showing the variation in the resistance of a solder joint made of a Sn-1Ag-0.5Cu-4In solder alloy and a Sn-1Ag-0.5Cu-13In solder alloy, respectively, according to the present invention as a function of the length of time of an EM test.

FIG. 8 is a SEM photograph of a cross section of a solder joint faulted from a Sn-0.7Cu solder alloy as a comparative example on a Cu electrode having a Ni/Au coating at the end of an EM test for 2500 hours.

FIG. 9 is a SEM photograph of a cross section of a solder joint formed from a Sn-7In-1Ag-0.5Cu solder alloy according to the present invention on a Cu electrode having a Ni/Au coating at the end of an EM test for 2500 hours.

FIG. 10 is a plan view and an end view of a test piece used in a tensile test.

FIG. 11 is a graph showing the tensile strength of a Sn-(0-15)In-1Ag-0.5Cu solder alloy as a function of the In content thereof.

FIG. 12 is a graph showing the elongation at failure of a Sn-(0-15)In-1Ag-0.5Cu solder alloy as a function of the In content thereof.

MODES FOR CARRYING OUT THE INVENTION

The present invention will next be described in detail. In this description, percent with respect to the composition of a solder alloy means mass percent unless otherwise indicated.

A Sn—In—Ag—Cu solder alloy according to the present invention contains 1.0-13.0% of In, which makes it possible to suppress the growth of voids due to electromigration. Below, the relationship between Sn, In, and electromigration will be explained in detail.

When a solder joint made of a solder alloy according to the present invention conducts electricity at a high temperature, Sn preferentially migrates toward the anode side of the solder joint along with the flow of electrons as discussed later, leaving lattice vacancies on the cathode side. On the other hand, In fills the lattice vacancies formed on the cathode side, leading to the formation of a Sn-rich layer on the anode side and an In-rich layer on the cathode side of the solder joint. As the In content of the solder alloy increases, the above-described phenomenon becomes more marked, and the In-rich layer and the Sn-rich layer increase in thickness. As a result, when an EM test is carried out on a solder joint by passing an electric current at a high current density at a high temperature, during the period until approximately 500 hours have elapsed, a resistance shift in which the resistance of the solder joint increases is observed. This increase in resistance in the initial stage of an EM test is thought to be caused by the above-mentioned phase separation (the formation of an Sn-rich layer and an In-rich layer).

As shown in Table 1, the resistivity of In is about 8 times that of Sn. Therefore, the increase in resistance of a solder joint made from a Sn—In—Ag—Cu solder alloy in the initial stage of an EM test is thought to be attributable to the growth of an In-rich layer. This increase in the initial stage is expected to be greater as the thickness of the In-rich layer is thicker.

When In atoms fill the lattice vacancies formed on the cathode side as a result of migration of Sn atoms, In atoms can substitute for the sites of lattice vacancies which were formerly occupied by β-Sn, thereby forming a solid solution. Such substitution of In atoms in the form of a solid solution is thought to suppress void nucleation on the cathode side, thereby increasing the resistance of the solder joint to electromigration (suppression of the growth of voids due to electromigration).

TABLE 1

| Metal | Atomic radius (pm) | Resistivity (ohm · cm) | Melting point (° C.) |
|---|---|---|---|
| In | 167 | 83.7 | 157 |
| Sn | 140 | 10.1 | 232 |

In a binary alloy, when the two elements constituting the alloy which have different diffusivity want to migrate in the same direction, only the one species having the larger diffusivity preferentially migrates in the intended direction, leaving lattice vacancies. The other species having the smaller diffusivity fills the lattice vacancies. In general, the larger the effective charge number, the greater the diffusivity. The effective charge numbers for Sn and In are −18 and −2, respectively. The term "effective charge number" used herein indicates the degree of easiness of the occurrence of electromigration. Accordingly, Sn, which is greater in the absolute value of effective charge number, preferentially migrates in the intended direction along with the flow of electrons, while In fills the lattice vacancies formed by migration of Sn.

Therefore, the formation of an In-rich layer involves two steps, namely, the occurrence of a flow of Sn atoms toward the anode side which is induced by EM and the occurrence of a flow of In atoms in the opposite direction. The flow of Sn atoms is produced as a result of collision of Sn atoms with electrons accompanied by momentum transfer. Due to the migration of Sn, the other atom, In cannot remain in its initial position in the lattice which it assumed before conduction, and it must migrate in the opposite direction from Sn. When Sn atoms start to migrate towards the anode side of a solder joint together with electrons, a compressive stress develops on the anode side of the solder joint. On the other hand, a tensile stress develops on the cathode side of the solder joint, resulting in the formation of a stress gradient between the anode and cathode. If the stress gradient is sufficiently large, In, which is relatively difficult to migrate, starts to migrate from the anode side toward the cathode side of the solder joint. Accordingly, it takes a certain time to form an In-rich layer which appears as an increase in resistance in the initial stages of an EM test. As shown in FIGS. 6 and 7 which are discussed later, the time required to form an In-rich layer is in the range of 100 to 500 hours, for example, and it depends on the In content of a solder alloy (the lower the In content, the shorter). When the In content is minute as in the solder alloy disclosed in Patent Document 1, the time required to form an In-rich layer is reduced, but filling of lattice vacancies by In becomes inadequate and voids end up growing.

When Sn forms a thin Sn-rich layer at the interface on the anode side of a solder joint, almost all In migrates from the Sn-rich layer toward the cathode side. FIG. 1 schematically shows the relationship between the concentration of In in a solder joint after an EM test and the distance from the anode side of the solder joint. As shown in FIG. 1, after an electric current with a high current density is passed through a solder joint for a long period of time, the In concentration ($C_1$) in the Sn-rich layer having a small distance from the anode side of a solder joint is nearly zero, and in the central portion of the solder joint (solder matrix) between the cathode and anode sides (indicated as a Sn—In layer in FIG. 1), the In concentration of the solder alloy before bonding is $C_2$. The In concentration in the In-rich layer which is located away from the anode side is much higher than $C_2$. In this case, the rate of growth of the Sn-rich layer can be expressed by the following Equation (1):

$$(C_2 - C_1)\frac{dy}{dt} = J_{Sn} = C_{Sn} \times \frac{D_{Sn} \times z^*}{\kappa T} \times e \times \rho \times j \quad (1)$$

where, y is the thickness of the Sn-rich layer, t is the conduction time (duration of passage of current), $C_1$ and $C_2$ are respectively the In concentration in the Sn-rich layer and the solder alloy, $J_{Sn}$ is the EM-induced atomic flux of Sn, $C_{Sn}$, $D_{Sn}$, and $z^*$ are respectively the concentration, diffusivity, and effective charge number of Sn which is the diffusing species in the base solder, $\rho$ is the resistivity of the solder alloy, $\kappa$ is Boltzmann's constant, T is the temperature, e is the electron charge, and j is the current density.

If the EM-induced atomic flux of Sn is limiting, the growth rate of the Sn-rich layer dy/dt should be constant, which reveals that the growth rate of the Sn-rich layer has a linear dependency on the conduction time. However, if the diffusion of In in the Sn-rich layer is limiting, the growth rate of the Sn-rich layer is controlled by the slower In diffusion and can be expressed by the following Equation (2):

$$(C_2 - C_1)\frac{dy}{dt} = J_{In} = -D_{In}\frac{dC_{In}}{dx} \quad (2)$$

where, $J_{In}$ is the diffusion flux of In out of the anode side, namely, from the Sn-rich layer, $D_{In}$ is the diffusivity of In, $C_{In}$ is the In concentration of the solder alloy, and x is the distance from the Sn-rich layer in the direction perpendicular to the Sn-rich layer. Seeing that the growth rate of the Sn-rich layer or the In-rich layer is depending upon the In concentration in the solder alloy and obey a parabolic dependence, this is in agreement with Equation (2).

As discussed above, with a Sn—In—Ag—Cu solder alloy according to the present invention, due to the presence of a sufficient amount of In, after Sn forms a Sn-rich layer on the anode side of a solder joint as a result of conduction which causes Sn to preferentially migrate toward the anode side, the above-described stress gradient causes In to migrate toward the cathode side of the solder joint and form an In-rich layer on the cathode side. At this time, In can fill lattice vacancies formed by migration of Sn and thereby suppress the formation of lattice vacancies. As a result, the growth 0 of voids due to electromigration can be suppressed, resulting in preventing failure of a solder joint.

The alloy composition of a solder alloy according to the present invention is as follows.

The In content of a solder alloy according to the present invention is at least 1.0% to at most 13.0%. Indium is effective at suppressing the occurrence of electromigration during conduction and improving the mechanical properties of a solder joint at high temperatures, and it lowers the melting point of the solder alloy. If the In content is larger than 13.0%, the mechanical properties and particularly the ductility of a solder alloy deteriorate. If the In content is less than 1.0%, the effect of the addition of In cannot be adequately exhibited. The lower limit on the In content is preferably 2.0% and more preferably 5.0%. The upper limit of the In content is preferably 13.0% and more preferably 10.0%.

From the standpoint of obtaining excellent tensile strength without deteriorating elongation at failure, it is particularly preferable for the In content to be in the range of 5.0-10.0%. After soldering is carried out with a Sn—In—Ag—Cu solder alloy according to the present invention and an electric current is passed through the resulting solder joint, as shown in FIG. 1, the initial composition of the solder alloy is maintained in the central portion between the cathode and anode sides (indicated as a Sn—In layer in FIG. 1) of the solder joint. In a solder alloy according to the present invention, due to the form of In which is in solid solution in a Sn phase, the solder alloy has a high tensile strength at a high temperature, and a decrease in elongation at failure can also be suppressed. Accordingly, if a solder alloy according to the present invention has an In content of 5.0-10.0%, not only is it possible to suppress failure of a solder joint due to electromigration, it is also is possible to obtain excellent mechanical properties at high temperatures.

The Ag content of a solder alloy according to the present invention is 0.1-4.0%. Ag is effective at improving the wettability and mechanical properties such as the tensile strength of a solder alloy. If the Ag content is greater than 4.0%, the liquidus temperature (also referred to liquidus line temperature or LL) of the solder alloy ends up increasing. If the Ag content is less than 0.1%, wettability deteriorates. The Ag content is preferably at least 0.3% to at most 3.0%.

The Cu content of a solder alloy according to the present invention is 0.3-1.0%. Cu is effective at improving the wettability and mechanical properties such as the tensile strength of a solder alloy and suppressing Cu erosion of electrodes or terminals which are typically made of Cu. If the Cu content is greater than 1.0%, the wettability of the solder alloy deteriorates and the liquidus temperature thereof increases. If the Cu content is less than 0.3%, the bonding strength of a solder joint deteriorates. The Cu content is preferably at least 0.5% to at most 0.7%.

A solder alloy according to the present invention preferably has an alloy composition consisting essentially of In: 1.0-13.0%, Ag: 0.3-3.0%, Cu: 0.3-1.0%, and a remainder of Sn, more preferably In: 2.0-13.0%, Ag: 0.3-3.0%, Cu: 0.5-0.7%, and a remainder of Sn. Another preferably solder alloy according to the present invention has an alloy composition consisting essentially of In: 5.0-10.0%, Ag: 0.1-1.5%, Cu: 0.3-1.0%, and a remainder of Sn.

Bonding using a solder alloy according to the present invention does not require special conditions and may be carried out by the reflow method in a conventional manner. Specifically, reflow soldering is generally carried out at a temperature of from a few degrees to around 20° C. higher than the liquidus temperature of the solder alloy.

A solder joint according to the present invention is suitable for use to connect an IC chip to its substrate (an interposer) in a semiconductor package or connect a to semiconductor package to a printed circuit board. The term "solder joint" which connects between two terminals means the portion from one terminal to the other terminal.

When a solder joint according to the present invention undergoes conduction with a current density of 0.12 mA/$\mu$m$^2$ in air at 165° C., it is preferable that the percent increase in the resistance after 2500 hours of conduction be at most 30% when compared to the resistance before the start of conduction and at most 5% when compared to the resistance after 500 hours of conduction. As a result, even when a solder joint according to the present invention is used for conduction for long periods in such a high temperature, high current density environment, breakdown due to electromigration does not take place.

A solder joint according to the present invention is thought to have excellent heat resistance at high temperatures when not conducting. Therefore, a solder joint according to the present invention can be formed by the above-described bonding method using typical soldering conditions.

The suppression of electromigration according to the present invention is realized by forming a solder joint using a solder alloy according to the present invention for bonding between a semiconductor element and a substrate, for example. In the present invention, it is possible to suppress the formation of voids due to electromigration in a solder joint during electrical conduction, which can takes place in solder joints which carry electric current inside a CPU during its operation.

A solder alloy according to the present invention can be used in the form of a preform, a wire, a solder paste, a solder ball (also called solder sphere), or the like. For example, solder balls may have a diameter in the range of 1-100 $\mu$m.

A solder alloy according to the present invention can also be used to manufacture low $\alpha$-ray solder balls by use of low $\alpha$-ray materials in the preparation of the solder alloy. Such low $\alpha$-ray solder balls can suppress software errors when used to form solder bumps in the periphery of memories.

Example

Various lead-free Sn—Ag—Cu—In solder alloys were prepared in order to to investigate electromigration of solder joints formed from the solder alloys and evaluate the mechanical properties of the solder alloys in the following manner.

1. Measurement of Electromigration (EM Test)

Prior to an EM test, first, the solderability performance of a Sn-4In-1Ag-0.5Cu solder alloy, a Sn-7In-1Ag-0.5Cu solder alloy, and a Sn-13In-1Ag-0.5Cu solder alloy was investigated. Solder balls of a solder alloy to be tested were placed on Cu pads having a Ni/Au coating and soldered by reflow using a water-soluble non-halogenated flux to form solder bumps.

FIG. 4 is a SEM photograph of a cross section of a solder bump made of a Sn-7In-1Ag-0.5Cu solder alloy at a magnification of 5000×. An intermetallic compound 43 was formed at the interface between a solder bump 41 and a Ni coating 42. The intermetallic compund 43 is a typical acicular Ni—Sn intermetallic compound, indicating that the soldering reaction between the solder alloy and the Ni/Au coating is very good. Thus, it was confirmed that the solderability of this lead-free solder alloy was excellent. The formation of a Ni—Sn intermetallic compound as shown in FIG. 4 was also observed in solder joints made of the other solder alloys according to the present invention having an In content of 4% or 13%. Accordingly, the solderability performance of all these solder alloys according to the present invention is excellent.

FIG. 2 shows a schematic vertical cross sectional view (a) and a schematic plan view (b) of a FCLGA (flip chip land grid array) package 10 used for an EM test. As shown in FIG. 2 by way of example, the FCLGA package 10 comprised a die 11 measuring 10 mm×10 mm×750 $\mu$m in thickness, a die substrate 12 measuring 22 mm×22 mm×1.0 mm in thickness, and an organic laminate substrate 13 measuring 35 mm×35 mm×1.2 mm in thickness. The die 11 and the die substrate 12 are bonded by flip chip (FC) bonding 14, while the die substrate 12 and the organic laminate substrate 13 are bonded by BOA bonding.

In this example, an EM test of solder joints was carried out using an FCLGA package having FC-bonded solder joints formed from solder balls made of a solder alloy according to the present invention or a comparative solder alloy by the above-described method. The solder alloy according to the present invention had a composition of Sn-(4, 7, or 13)In-1Ag-0.5Cu, and the comparative solder alloy had a composition of Sn-0.7Cu.

As schematically shown in FIG. 3, in the EM test, the part device was designated so that a whole row of solder bumps could be tested in the same polarity and with the same current. Thus, in this part, the overall resistance of the solder joints in a row having the same direction of current flow could be measured.

The EM test was performed in a chamber. The chamber in which a FCLGA package to be tested was already placed was heated to 165° C. and maintained at that temperature. Once a steady state of the temperature had been reached, a constant current of 950 mA was applied to the test part (the FCLGA package), and the resistance was continuously monitered in situ for 2500 hours or longer. The current density in each solder bump during conduction was 0.12 mA/$\mu$m$^2$ (calculated by the equation: 950 mA/($\pi\times(100$ $\mu$m/2)$^2$).

The test results for a Sn-7In-1Ag-0.5Cu solder alloy are shown in Table 2 along with the results of the Sn-0.7Cu comparative solder alloy. Table 2 shows the percent increase in resistance at different lengths of time after the start of the EM test. Each value in Table 2 is the average for 5 rows of solder joints.

TABLE 2

| Alloy Composition | % Increase in Resistance | | | | | |
|---|---|---|---|---|---|---|
| | Length of time of test [hr] | | | | | |
| | 0 | 10 | 500 | 900 | 1500 | 2500 |
| Sn—0.7Cu | 0 [%] | 0.5 [%] | 8 [%] | 17 [%] | 62 [%] | Conduction failure |
| Sn—7In—1Ag—0.5Cu | 0 [%] | 1.5 [%] | 23 [%] | 26 [%] | 27 [%] | 28 [%] |

FIG. 5 is a graph showing the relationship between the length of time of the test and the resistance of solder joints made of a Sn-0.7Cu solder alloy as a comparative example. FIG. 6 is a graph showing the relationship between the length of time of the test and the resistance of solder joints made from a Sn-7In-1Ag-0.5Cu solder alloy according to the present invention. FIGS. 5 and 6 each show the results of the electromigration for 5 rows of solder joints of each solder composition. The data shown in Table 2 were determined from the data in these graphs as an average for the 5 rows of solder joints.

As shown in FIG. 5, when a certain length of time passed for the comparative Sn-0.7Cu solder alloy, a typical electromigration resistance shift in the form of an abrupt increase in resistance was observed. Specifically, also as shown in Table 2, the increase in resistance was very gentle until approximately 900 hours after the start of the test. This length of time of 900 hours is thought to be the time until nucleation of voids starts and the voids grow to such an extent that causes an abrupt quality degradation. When 900 hours are exceeded, the resistance abruptly increased with the percent increase at 1500 hours being around 62%, and conduction failure occurred in two rows of the solder joints before 2500 hours. In addition, all the resistance of the 5 rows of solder joints showed a significant fluctuation after 900 hours and particularly after 1200 hours, indicating that the resistance became significantly unstable. The dispersion of the results in the 5 rows of solder joints was also large.

In contrast, as shown in FIG. 6 and Table 2, the resistance of solder joints made of a Sn-7In-1Ag-0.5Cu solder alloy according to the present invention increased by approximately 2% in the extremely early stage of an EM test (in around 10 hours). The resistance at 500 hours then increased by 23% compared to the start of the test. The resistance after 500 hours was nearly constant, and it remained stable as evidenced by the fact that the percent increase in resistance compared to the start of the test was only 28% even at 2500 hours. In addition, the dispersion in resistance in the 5 rows of solder joints and the fluctuation of the resistance in each joint were much smaller compared to FIG. 5. As shown in FIGS. 7(a) and 7(b), solder joints made of the other solder alloys according to the present invention which contains 4% or 13% In exhibited the same tendency as shown in FIG. 6. Namely, after the initial stage increase in resistance, the resistance remained stable even at 2500 hours. As the In content was higher, the initial stage increase in resistance became greater.

The mechanism of electromigration was investigated in a cross section of a solder joint after the EM test using a scanning electron microscope (SEM) and an electron probe mieroanalyzer (EPMA).

FIGS. 8 and 9 are SEM photographs of a cross section of a solder joint made of a comparative Sn-0.7Cu solder alloy and a Sn-7In-1Ag-0.5Cu solder alloy according to the present invention, respectively, after the EM test was carried out for 2500 hours. As shown in these figures, a solder joint 53 or 63 was formed from a solder ball so as to connect a Cu pad 56 or 66 having a Ni/Au plating formed on a die substrate and a Cu pad 51 or 61 formed on a die. In the EM test, a current was passed through the solder joints 53 or 63 so as to cause electrons to flow in the direction from the Cu pad 56 or 66 on the die substrate toward the Cu pad 51 or 61 on the die. Therefore, the Cu pad 56 and 66 on the die substrate functioned as a cathode while the Cu pad 51 or 61 on the die functioned as an anode.

As shown in FIGS. 8 and 9, a Cu—Sn intermetallic compound 52 or 62 was formed on each of the Cu pads 51 and 61 which was an anode. A Ni plating layer 55 or 65 was observed on each of the Cu pads 56 and 66 which was a cathode. The Cu—Sn intermetallic compound 52 or 62 and the Ni plating layer 55 or 65 were connected by the solder joints 53 or 63. Voids 54 or 64 were formed in each of the solder joints 53 and 63 between the cathode 56 or 66 and the Ni plating layer 55 or 65.

As shown in FIG. 8, when using a comparative Sn-0.7Cu solder alloy, voids 54 were formed in the solder joint 53 so as to make a line or a layer in the vicinity of the Ni plating layer 55 on the cathode 56. The formation of voids in such a state in a solder joint may cause the solder joint to be readily broken when undergoing a stress. In contrast, as shown in FIG. 9, in the case of a Sn-7In-1Ag-0.5Cu solder alloy according to the present invention, voids 64 formed in the solder joint 63 in the vicinity of the Ni plating layer 65 on the cathode 66 did not form a layer but formed separated masses of voids. Therefore, there was little concern of failure of conduction through the solder joint even after 2500 hours of an EM test.

In order to identify the atomic flow during the EM test, EPMA data was collected after completion of the EM test for 2500 hours. From this result, it was found that a solder joint made of a Sn-0.7Cu solder alloy behaved in a typical electromigration mechanism. Namely, when high density electron flows bombarded Sn atoms, Sn atoms were caused to migrate toward the anode side while voids were moved against the flow of electrons and accumulated in the cathode side.

In an In-containing Sn—Ag—Cu alloy according to the present invention, Sn atoms migrate along with electrons while In atoms migrate against the flow of electrons, thereby forming an Sn-rich layer in the anode side and an In-rich layer in the cathode side. The formation of these layers is thought to take place by the previously discussed mechanism.

2. Mechanical Properties

The solder alloys having compositions shown in Table 3 [Sn-xIn-1Ag-0.5Cu (x=0-15)] and Table 4 [Sn-xIn-(0 or 1)Ag-0.7Cu (x=0-15)] were cast into molds to prepare test pieces having the shape shown in FIG. 10. In this figure, the numerals show dimensions in mm. For example, the parallel portion of each test piece had a diameter of 8 mm and a length of 30 mm. The test piece was prepared by casting each solder alloy at a temperature 100° C. above the liquidus temperature of the composition into a split mold which was processed to the shape shown in FIG. 10 followed by air cooling to room temperature and removal of the resulting cast piece from the split mold.

Using a tensile tester, tension was applied to the test piece in air at either room temperature (RT) or 125° C. at a speed of 6 mm per minute, and the tensile strength and the elongation at failure were calculated from the load and displacement read from a load cell. The results are shown in Tables 3 and 4.

TABLE 3

| In | SL | LL | Tensile Strength (MPa) | | Elongation (%) | |
|---|---|---|---|---|---|---|
| (mass %) | (° C.) | (° C.) | RT | 125° C. | RT | 125° C. |
| 0 | 216.9 | 225.7 | 35.7 | 17.6 | 74.9 | 59.6 |
| 1 | 213.1 | 224.0 | 33.5 | 17.2 | 70.2 | 63.8 |
| 2 | 209.1 | 221.6 | 36.1 | 18.2 | 69.6 | 65.9 |
| 3 | 208.4 | 219.2 | 39.8 | 19.0 | 63.7 | 63.7 |
| 4 | 205.8 | 217.5 | 51.3 | 25.5 | 37.4 | 44.6 |
| 5 | 203.0 | 215.8 | 55.2 | 26.4 | 45.3 | 46.5 |
| 6 | 199.0 | 213.8 | 55.8 | 26.7 | 50.2 | 48.4 |
| 7 | 196.5 | 212.5 | 57.2 | 26.5 | 45.7 | 53.5 |
| 9 | 191.2 | 209.8 | 56.8 | 25.1 | 40.8 | 46.3 |
| 10 | 187.5 | 207.8 | 57.0 | 24.4 | 41.1 | 47.3 |
| 13 | 180.0 | 202.7 | 52.9 | 20.5 | 36.4 | 41.4 |
| 15 | 177.2 | 200.9 | 45.7 | 16.4 | 38.9 | 7.3 |

Alloy composition (mass %): Sn—xIn—1Ag—0.5Cu (x = 0-15)
SL = solidus line temperature; LL = liquidus line temperature

TABLE 4

| Ag | In | SL | LL | Tensile Strength (MPa) | | Elongation (%) | |
|---|---|---|---|---|---|---|---|
| (mass %) | (mass %) | (° C.) | (° C.) | RT | 125° C. | RT | 125° C. |
| 0 | 0 | 227.3 | 229.2 | 32.0 | | 75.6 | |
| 1 | 0 | 216.7 | 224.0 | 34.4 | 16.2 | 73.3 | 66.8 |
| 1 | 1 | 213.1 | 222.7 | 35.3 | 17.1 | 82.9 | 64.7 |
| 1 | 2 | 209.7 | 221.0 | 42.2 | 18.0 | 79.4 | 69.6 |
| 1 | 3 | 208.3 | 218.8 | 42.7 | 20.0 | 71.8 | 59.5 |
| 1 | 4 | 205.6 | 215.5 | 47.7 | 23.0 | 56.3 | 56.5 |
| 1 | 5 | 203.1 | 214.3 | 55.3 | 27.2 | 53.4 | 47.1 |
| 1 | 6 | 199.1 | 212.9 | 56.8 | 26.6 | 48.2 | 50.3 |
| 1 | 7 | 196.6 | 211.9 | 57.7 | 26.5 | 42.4 | 53.5 |
| 1 | 9 | 191.2 | 208.5 | 58.2 | 26.6 | 37.4 | 56.1 |
| 1 | 10 | 186.0 | 207.0 | 58.0 | 23.9 | 38.0 | 52.4 |
| 1 | 13 | 176.5 | 202.1 | 53.1 | 20.7 | 38.2 | 48.0 |
| 1 | 15 | 177.9 | 199.0 | 46.7 | 16.5 | 40.7 | 16.8 |

Alloy composition (mass %): Sn—xIn—(0 or 1)Ag—0.7Cu (x = 0-15)
SL = solidus line temperature; LL = liquidus line temperature As shown in Tables 3 and 4, alloy compositions having a Cu content of either 0.5% or 0.7% exhibited the same tendency. In particular, a solder alloy having an In content of at least 4% for the case of a Cu content of 0.5% or at least 5% for the case of a Cu content of 0.7% exhibited a high tensile strength both at room temperature and at a high temperature. At 125° C., elongation at failure abruptly deteriorated if the In content exceeded 13%.

FIG. 11 is a graph showing the relationship between the tensile strength and the In content of Sn-(0-15)In-1Ag-0.5Cu solder alloys at room temperature and 125° C. FIG. 12 is a graph showing the relationship between elongation at failure and the In content of Sn-(0-15)In-1Ag-0.5Cu solder alloys at room temperature and 125° C. The measurement temperature at a high temperature was made 125° C. because the operating temperature of semiconductor elements in recent years has reached around 100° C., so it was necessary to, perform measurement in a more severe environment.

As shown in FIG. 11, the tensile strength abruptly increased when the In content exceeded 4%, and at an In content of 5-10%, the tensile strength exhibited a high value even at a high temperature of 125° C. On the other hand, the tensile strength deteriorated when the In content exceeded 13%. As shown in FIG. 12, elongation at failure gradually worsened as the In content increased, and at 125° C., it abruptly deteriorated if the In content exceeded 13%. The same tendency as illustrated in FIGS. 11 and 12 for tensile strength and elongation at failure was exhibited with Sn-(0-15)In-1Ag-0.7Cu solder alloys as shown in Table 4.

As set forth above, because a solder alloy according to the present invention contains 1.0-13.0% of In in a Sn—Ag—Cu solder alloy, the occurrence of electromigration which tends to develop with such a lead free solder alloy and which eventually causes failure of a solder joint can be suppressed. In addition, when the In content of the solder alloy is 5-10%, not only can the occurrence of electromigration be suppressed more effectively, but the solder alloy can exhibit excellent mechanical properties at high temperatures.

Accordingly, a solder alloy according to the present invention can be used not only in CPUs but also in equipment which involves high voltages and high currents such as power conversion equipment for solar power generation or high-current inverters for industrial motors. For the solder alloy having an In content of 5-10%, due to its excellent mechanical properties, it can also be used for power semiconductors mounted on motor control inverters for electric vehicles (EV) and plug-in hybrid vehicles (PHV).

The invention claimed is:

1. A solder joint made from a lead-free solder alloy having an alloy composition consisting of:
   In of 5.0 through less than 7.0 mass %;
   Ag of 0.1 through 0.3 mass %;
   Cu of more than 0.5 through 1.0 mass %; and
   a remainder of Sn,
   wherein when the solder joint is under an energizing condition at a current density of 0.12 mA/μm$^2$ in air at 165 degrees C., the percent increase in a resistance value of the solder joint from a resistance value before the energization to a resistance value when 2500 hours have elapsed after the start of the energization is not more than 30% and a difference between the percent increase in a resistance value and a percent increase in a resistance value when 500 hours have elapsed from the start of the energization is not more than 5%, and
   wherein the solder joint is included in:
   power conversion equipment for solar power generation;
   a high-current inverter;
   power semiconductors on a motor control inverter for an electric vehicle or plug-in hybrid vehicle; or
   a CPU, in which the current density per terminal is around $10^4$-$10^5$ A/cm$^2$.

2. A method for suppressing electromigration of a solder joint during electrical conduction comprising forming the solder joint using a lead-free solder alloy as set forth in claim 1.

3. A solder joint made from a lead-free solder alloy as set forth in claim 1, wherein the solder joint is included in the power conversion equipment for solar power generation.

4. A solder joint made from a lead-free solder alloy as set forth in claim 1, wherein the solder joint is included in the high-current inverter.

5. A solder joint made from a lead-free solder alloy as set forth in claim 1, wherein the solder joint is included in the power semiconductors on the motor control inverter for the electric vehicle or plug-in hybrid vehicle.

6. A solder joint made from a lead-free solder alloy as set forth in claim 1, wherein the solder joint is included in the CPU, in which the current density per terminal is around $10^4$-$10^5$ A/cm$^2$.

7. A solder joint made from a lead-free solder alloy as set forth in claim 1, wherein a current density of 0.12 mA/μm$^2$ passes through the solder joint.

* * * * *